WELDABLE TAB FOR PRINTED CIRCUITS AND METHOD OF FABRICATION

Filed Jan. 10, 1966 3 Sheets-Sheet 1

INVENTORS.
JAMES R. KUBIK,
WILLIAM P. DUGAN,
By [signature]
ATTORNEY.
L. E. Carnahan
AGENT.

WELDABLE TAB FOR PRINTED CIRCUITS AND METHOD OF FABRICATION

Filed Jan. 10, 1966 3 Sheets-Sheet 2

INVENTORS.
JAMES R. KUBIK,
WILLIAM P. DUGAN,
By [signature]
ATTORNEY.
L E Carnahan
AGENT.

INVENTORS.
JAMES R. KUBIK,
WILLIAM P. DUGAN,
By [signature]
ATTORNEY.
L. E. Carnahan
AGENT United States Patent Office
3,342,927
Patented Sept. 19, 1967

3,342,927

WELDABLE TAB FOR PRINTED CIRCUITS AND METHOD OF FABRICATION

James R. Kubik, Upland, and William P. Dugan, Ontario, Calif., assignors to General Dynamics Corporation, a corporation of Delaware Filed Jan. 10, 1966, Ser. No. 519,719
14 Claims. (Cl. 174—68.5)

ABSTRACT OF THE DISCLOSURE

Broadly, this disclosure is directed to weldable tab ends for printed circuits wherein the tab ends are an integral part of the printed circuit and are adapted to remain horizontal or be bent into a perpendicular position relative to a substrate. The tabs are to be used for interconnection of related circuits and components into a high density electronic package. Disclosed are various procedures for fabricating the weldable tab ends and which generally involve the plating of nickel upon a copper layer which is secured to a dielectric and utilizing a passivated metallic pad underlying the tab end so that the tab, if desired, can be bent into a perpendicular or other angular position to permit the separation of the tab portion from the copper circuit.

This invention relates to means and methods for obtaining electrical connections between circuit elements, and more particularly to a weldable tab for printed circuits and method of fabricating same.

One of the present day problems involving printed circuit boards is providing an effective yet inexpensive manner of joining permanent and removable components with the conductors which have been printed or otherwise positioned on dielectric material in accordance with modern processes.

In the prior art where printed, stamped out, electrodeposited, or equivalent circuitry has been employed, it has been found necessary to utilize metallic sleeves, thimbles, tube sockets, or the like, at points along the circuit where it was desired to connect into the circuit conventional wire or component leads.

Other prior art attempts have been directed to a method of assembly of individual components with respect to the circuit conductors by which they are interconnected by an arrangement of projecting metallic terminal tabs whereby all the electrical junctions may be on the exterior surface of the packaged circuit where they are accessible for soldering or welding, and for test purposes or repair. Such prior art attempts are exemplified by U.S. Patents Numbers 3,129,280 and 3,151,278.

The present invention relates to a concept similar to that described in the above referenced patents in that it utilizes projecting metallic terminal tabs but differs both in the end item and in the method of manufacturing of the circuit boards including the tabs.

Therefore, it is an object of this invention to provide a means and method whereby interconnection of electronic circuits and components can be readily accomplished.

A further object of the invention is to provide weldable tab ends which are an integral part of a printed circuit.

Another object of the invention is to provide a method of fabricating circuits having integral passivated tab ends for the interconnection of associated components.

Another object of the invention is to provide a means and method for interconnecting related circuits and components into a high density electronic package.

Another object of the invention is to provide a circuit board with tabs integral with circuits positioned thereon to facilitate interconnection of the wiring of the circuit board to the leads of electronic components by any desired method, such as by conventional soldering or resistance welding.

Other objects of the invention not specifically set forth above will become readily apparent from the following description and accompanying drawings wherein.

Figure 1:
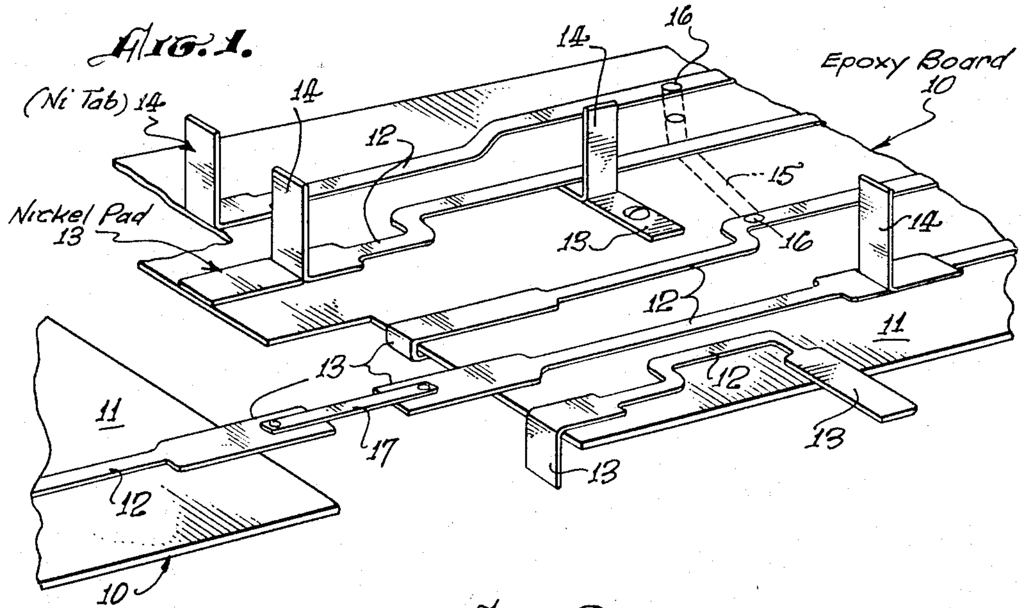
FIG. 1 is a perspective view of a pair of circuit boards illustrating the end product of the invention.

Referring now to the drawings, FIG. 1 shows a pair of circuit boards 10 made in accordance with the invention and generally comprising an epoxy substrate 11, circuits 12 which terminate in pads 13 and/or tabs 14, with certain of circuits 12 being interconnected as indicated in phantom at 15 via plated-thru-hole type terminals 16. The boards 10 are interconnected for example by a lead or line 17 intermediate a pad 13 on each board.

Figure 2:
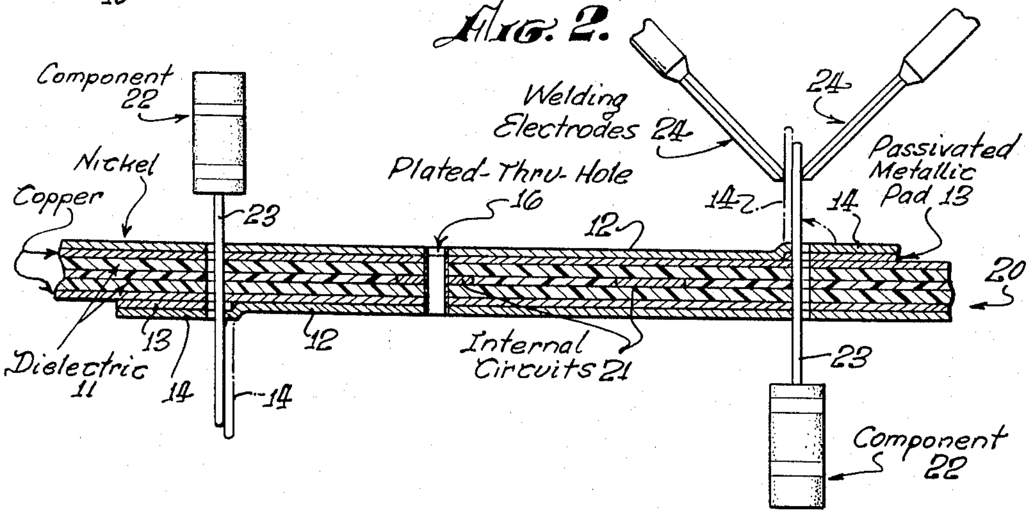
FIG. 2 is a cross-sectional view of a multi-layer electronic package made in accordance with the invention.

A multi-layer circuit board 20 illustrated in FIG. 2 is provided with circuits 12 which terminate in passivated metallic pads 13 and tabs 14 on the upper and lower surfaces thereof. The board 20 is also provided with internal circuits 21 which may be interconnected to external circuits 12 via a plated-thru-hole type terminal 16. Electronic components 22 are shown having their leads 23 extending through apertures in the board 20 and adapted to be interconnected to tabs 14 when said tabs are bent perpendicular to the pads 13 as shown in dotted lines. The component leads 23 are connected to tabs 14 by current flow through welding electrodes 24 or by other interconnection methods such as soldering or surface welding.

As illustrated in FIG. 2 the circuit board 20 is constructed generally of a pair of double copper clad epoxy sheets with the circuits 12 and pads 13 being over plated with nickel and the tabs 14 constructed of nickel as will become evident from the description of the method of fabrication hereinafter. The FIG. 1 circuit board is constructed of a layer of dielectric forming the substrate 11 and a layer of copper overplated by a layer of nickel forming the circuits 12 and pads 13, with the tabs 14 constructed of nickel. However, it is not intended to limit this invention to any particular type of materials as other materials which can produce the desired end function can be utilized.

The following is a sequence of steps of a method of fabricating the FIG. 1 board, the steps being partially illustrated by FIGS. 3–10:

(1) Apply a coating of resist material 30 according to a predetermined circuit pattern on a copper layer 31 bonded to a dielectric base 32 of a copper clad epoxy board, for example. The resist 30 is applied by either the conventional photo-resist, silk-screen process, or other technique designed to leave blank areas 33 on the face (upper surface) of the copper layer 31. The blank areas 33 correspond to the desired location and pattern of the pads 13, as shown in FIG. 3.

Figures 3, 4, 5, 6, 7, 8, 9, 10, 11, 12, 13, 14, 15, 16, 17, 18:
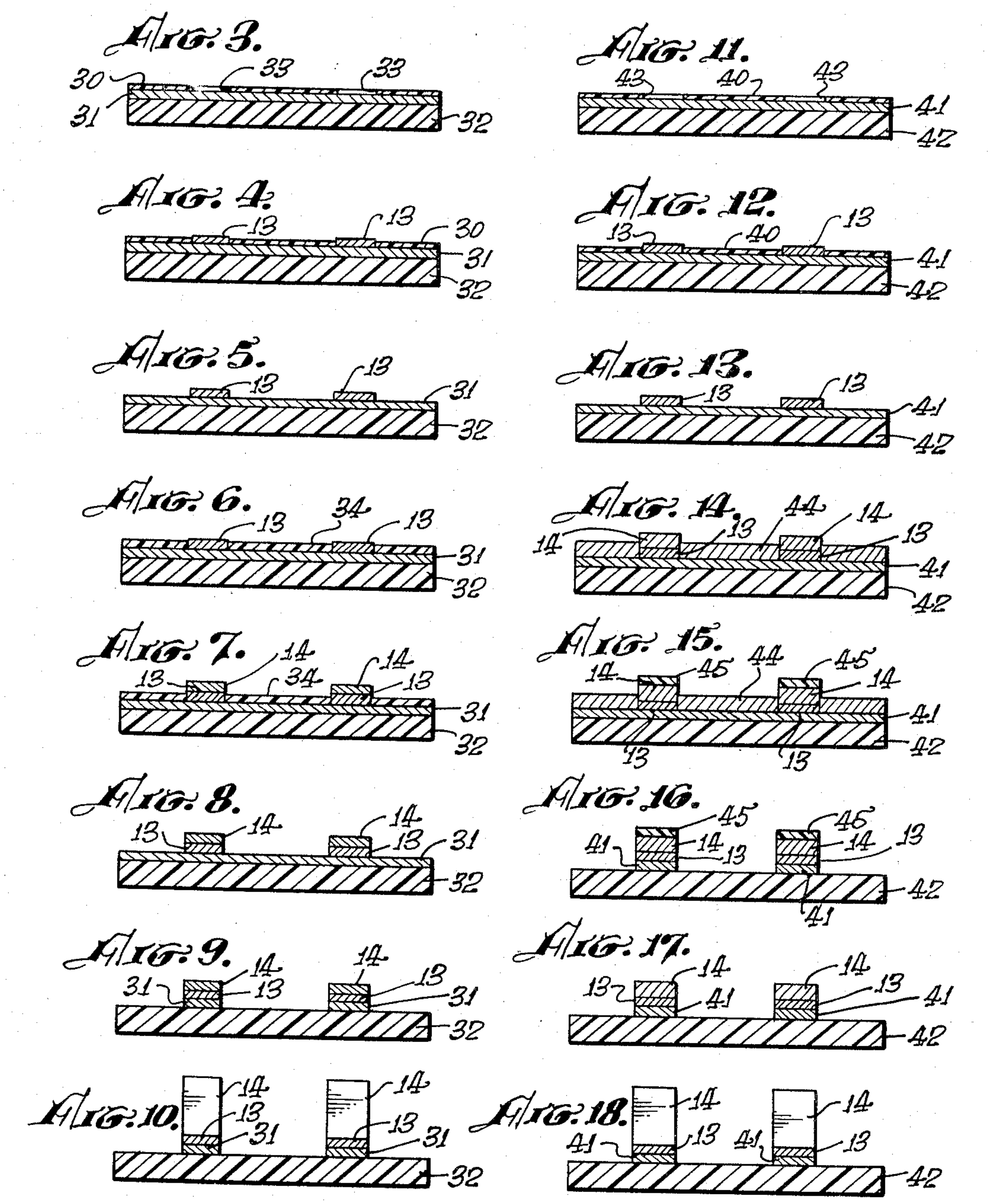
FIGS. 3–10 are cross-sectional views illustrating various steps of a method of fabricating the FIG. 1 circuit board and integral interconnecting pads and tabs.
FIGS. 11–18 are cross-sectional views illustrating various steps of a modified method of fabricating the FIG. 1 device.

(2) Nickel plate the blank or exposed areas 33 to define the pads 13, as illustrated in FIG. 4, to a thickness, for example, of 0.0001 to 0.0003 inch.

(3) Remove the resist or masking material 30 by stripping or other desired methed (see FIG. 5).

(4) Apply resist material 34 on copper layer 31, as shown in FIG. 6, to define the pattern of circuits 12. The resist may be applied as described above in step 1.

(5) Alkali clean exposed circuit for 10 to 20 seconds.

(6) Water rinse for 10 to 20 seconds.

(7) Treat with an activator solution containing 4 lbs./gal. chromic acid to 4 fl. oz./gal. sulfuric acid for 10 to 20 seconds.

(8) Neutralize the thus treated circuit for 20 to 40 seconds.

(9) Water rinse for 10 to 20 seconds.

(10) Acid dip for 5 to 10 seconds in 10% $H_2SO_4$, for example.

(11) Water rinse for 10 to 20 seconds.

(12) Sulfamate nickel plate the exposed areas (circuits 12 and pads 13) to a thickness desired for the tabs 14, which, for example, may be 0.006 to 0.008 inch, as shown in FIG. 7.

(13) Water rinse for 10 to 20 seconds.

(14) Remove resist material 34 (see FIG. 8) with a solvent such as methyl ethyl ketone (MEK).

(15) Clean with pumice and hot water.

(16) Etch away exposed copper, as shown in FIG. 9, using for example, a solution containing 4 lbs./gal. chromic acid-4 fl. oz/gal. sulfuric acid. The remaining copper 31 and the covering nickel plating, except for the pads 13 and tab ends 14, comprises circuits 12 shown in FIG. 1.

(17) Water rinse for 30 to 40 seconds.

(18) Neutralize in an alkali for 10 to 30 seconds.

(19) Water rinse for 30 to 40 seconds.

(20) blow dry with clean compressed air.

(21) Trim circuit board to the desired configuration.

(22) Separate and bend up tabs 14, as shown in FIG 10 and in FIG. 1. This becomes possible due to the oxide layer between the two nickel layers created by the controlled passivated condition produced by steps (5) through (11).

The sequence of operation of a modified method of fabricating the FIG. 1 board, and partially illustrated in FIGS. 11–18, is as follows:

(1) Apply a coating of resist or masking material 40 according to a predetermined circuit pattern on a copper layer 41 which is bonded to a dielectric base material 42 of a copper clad epoxy board, for example. The resist 40 is applied by either a silk-screen or photo-resist process or other conventional technique designed to leave blank areas 43 on the upper surface of the copper layer 41. The blank areas 43 correspond to the desired pattern and location of the pads 13, as shown in FIG. 11.

(2) Nickel plate the blank or exposed areas 43 to define the pads 13, as illustrated in FIG. 12, to a thickness, for example, of 0.0001 to 0.0003 inch.

(3) Remove the resist or masking material 40 by stripping for example, with methyl ethyl ketone (MEK) or by other desired method (see FIG. 13).

(4) Activate the copper layer 41 and passivate the nickel pads 13 using a solution containing 4 lbs./gal. chromic acid to 4 fluid oz./gal. sulfuric acid.

(5) Water rinse for 10–20 seconds.

(6) Alkali clean the entire surface for 10–20 seconds.

(7) Water rinse for 10–20 seconds.

(8) Acid dip for 5 to 10 seconds in 10% sulfuric acid, for example.

(9) Water rinse for 10–20 seconds.

(10) Sulfamate nickel plate the entire metallic area (copper 41 and pads 13) to a thickness of tabs 14 which may be approximately 0.008 inch, for example. The nickel plating is indicated at 44 with the portion defining the tabs being indicated by 14 in FIG. 14.

(11) Apply resist or masking material 45 on the nickel plated area defining interconnecting circuits 12 and tabs 14 (see FIG. 15), the resist being applied by either silk screen or photo resist techniques.

(12) Chemical mill away the exposed nickel 44 and the underlying copper 41 using ferric chloride, as shown in FIG. 16. The remaining copper 41 and the covering nickel plating, except for the pads 13 and tabs 14, comprises circuits 12 shown in FIG. 1.

(13) Remove the resist material 45 (see FIG. 17) by stripping with MEK or by other suitable techniques.

(14) Rinse, neutralize and dry the thus plated board as described above in steps (17)–(21) of the illustrated method of FIGS. 2–10.

(15) Separate and bend up tabs 14 (see FIG. 18) at the end of circuits 12 as shown in FIG. 1. This is possible because of the controlled passivated condition between the two nickel layers (pads 13 and tabs 14) caused by the oxide layer on pads 13 prior to the plating of tabs 14 thereover.

While the above methods, partially illustrated by FIGS. 3–10 and FIGS. 11–18, have been described and shown as utilizing an epoxy board clad on only one side with copper, an insulator board clad on both sides may be utilized and, if desired, the circuits, pads and tabs may be fabricated on both sides of the two sided copper clad board simultaneously. Also, as pointed out above other types of dielectric and metals may be utilized and this invention is not intended to be limited to the specific materials described.

Since the method of fabricating the plated-thru-hole terminals 16 of FIGS. 1 and 2 does not constitute a part of this invention and since such processes are known in the art, a description of a process for producing the terminals 16 is deemed unnecessary.

Figure 19:
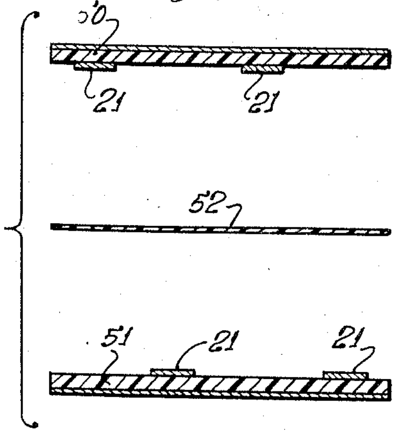
FIGS. 19–23 are views illustrating various steps of a method of fabricating multi-layer circuitry similar to that illustrated in FIG. 2.

The following sequence of steps, partially illustrated by FIGS. 19–23 set forth a method of fabricating a multi-layer circuit similar to that illustrated in FIG. 2:

(1) Etch away the copper on one side of each of the two sided copper clad epoxy insulator boards 50 and 51 so as to leave the copper in desired locations to define internal circuits 21 (see FIG. 2) as shown in FIG. 19.

Figure 20:
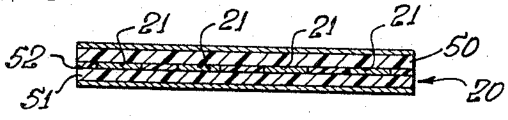
Figure 22:
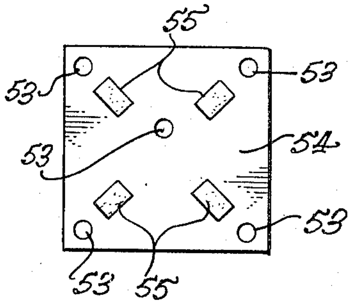

(2) With a sheet of B stage facer adhesive 52 (see FIG. 19) bond together the boards 50 and 51 in the manner illustrated in FIG. 20, thus forming a circuit board similar to the board 20 of FIG. 2.

Figure 21:
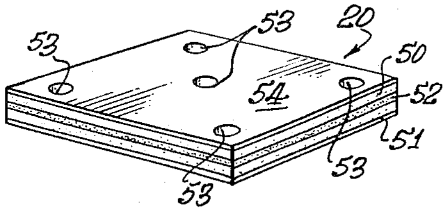

(3) Drill holes 53 through board 20 as shown in FIG. 21 for connection between the internal circuits 21 and external components as circuits as described hereinafter.

(4) Copper plate in conventional manner the board 20 for creating an electrical connection via holes 53 between the internal circuits 21 and the external copper surface 54, only one surface 54 being shown in FIG. 21.

(5) Using either the silk screening, photo-resist, or other conventional process, mask the surface 54 on each side of board 20 except in the areas 55 (see FIG. 22) desired to locate the pads 13 and nickel plate these areas to a thickness of 0.0001–0.0003 inch.

(6) Strip the resist or masking from the surfaces 54 using methyl ethyl ketone (MEK) or other suitable material.

(7) Silk screen or photo-resist the final configuration of the circuits 12 terminating in tabs 14 (see FIG. 2) on the surface 54 of board 20.

(8) Activate the areas of copper defining the circuits 12 and passivate the nickel pads 13 using a solution containing 4 lbs./gal. chromic acid-4 fl. oz./gal. sulfuric acid.

(9) Water rinse.

(10) Alkali clean.

(11) Water rinse.

(12) 10% sulfuric acid dip.

(13) Water rinse.

The time sequence of steps (8)–(13) may, for example, be similar to the times set forth above with respect to the similar fabrication steps used in producing the FIG. 1 circuit board.

Figure 23:
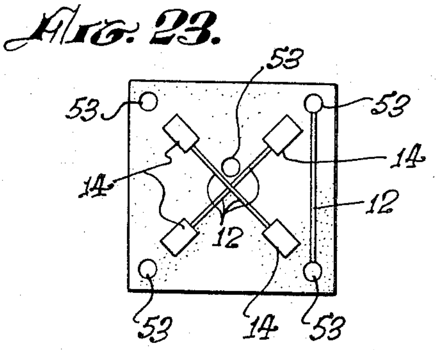

(14) Nickel plate in a sulfamate nickel plating solution the areas defining the circuits 12 and pads 13 shown in FIG. 23 to the desired thickness of tabs 14 which may be approximately 0.008 inch.

(15) Remove the resist from copper surfaces 54 using MEK or other known material.

(16) Etch away the exposed copper on both sides of board 20 using a solution containing 4 lbs./gal. chromic acid to 4 fl. oz./gal. sulfuric acid.

(17) Rinse, neutralize and dry the thus plated board as described above with respect to the method of fabricating the FIG. 1 board.

(18) Separate and bend up the tabs 14 at the end of the circuits 12 as shown in FIG. 2, thus producing a multi-layer circuit board having integral connector tabs 14 due to the passivated condition, between the nickel pads 13 and the tabs 14.

It has thus been shown that this invention provides a circuit board having weldable tab ends which are an integral part of a printer circuit, and methods for fabricating single layer and multi-layer boards of this type. The tabs may be bent perpendicular or other angular position or remain horizontal with respect to the circuit and used for interconnection of related circuits and components into a high density electronic package.

Although specific embodiments and methods for fabricating same have been illustrated and described, modifications will become apparent to those skilled in the art, and it is intended to cover in the appended claims all such modifications as come within the true spirit and scope of the invention.

What we claim is:

1. An article of manufacture comprising: an electronic circuit board including at least one dielectric sheet carrying at least one composite circuit pattern of a first conductive metal overplated by a dissimilar second conductive metal, terminal pads on said first conductive metal and formed integrally with said first conductive metal of said composite circuit pattern, and terminal tabs formed integrally with said overplated dissimilar second conductive metal of said composite pattern, said terminal tabs being located adjacent said terminal pads and adapted to be independently positioned with respect to said terminal pads.

2. The article of manufacture defined in claim 1, wherein said first conductive metal is copper and said second conductive metal is nickel.

3. The article of manufacture defined in claim 1, wherein said circuit board is provided with circuit patterns, terminal pads, and terminal tabs on two external surfaces thereof.

4. The article of manufacture defined in claim 3, wherein said circuit board includes circuit patterns constructed of said first conductive metal located intermediate said first mentioned circuit patterns and electrically connected to at least one of said first mentioned circuit patterns.

5. The method of manufacturing electronic circuit boards consisting of the sequential steps of: applying a resistive mask on at least one metallic surface of a metallic laminated dielectric board leaving at least one blank area, plating the metallic surface of the blank area with a different conductive metal than the metal of the metallic surface to form a terminal pad, removing the resistive mask, applying a resistive mask on at least one metallic surface of the laminated dielectric board defining at least one circuit pattern terminating adjacent the terminal pad, activating the unmasked metal defining the at least one circuit pattern and passivating the unmasked metal of the terminal pad, plating the activated and passivated metals with a metal similar to the passivated metal to define at least one terminal tab adjacent the terminal pad, removing the resistive mask, etching away the exposed metal of the at least one metallic surface, and separating the terminal tabs from the terminal pads due to the passivated condition therebetween.

6. The method defined in claim 5, additionally including the sequential steps of: forming at least one circuit pattern internally of the dielectric material of the board, and forming at least one conductive interconnection between the at least one external circuit pattern and the at least one internal circuit pattern, the additional sequential steps being accomplished prior to the step of activating and passivating the metals.

7. The method defined in claim 6, wherein the additional sequential steps are accomplished by: etching away portions of one metallic surface of each of a plurality of double metallic clad laminated dielectric boards so as to leave portions of the one metallic surface in desired locations to define the at least one internally located circuit pattern, bonding together the plurality of double metallic clad laminated dielectric boards with appropriate adhesive material such that the at least one internally located circuit pattern is intermediate the external surfaces of the thus bonded boards, forming at least one aperture through the thus bonded boards at desired locations, creating electrical pattern and at least one of the external metallic surfaces of the bonded boards by plating with a conductive metal the exposed surfaces defining the aperture.

8. The method defined in claim 7, wherein the step of activating and passivating the metals includes applying an activator solution, water rinsing, alkali cleaning, water rinsing, dipping in 10% sulfuric acid, and water rinsing.

9. The method defined in claim 8, wherein the step of applying an activator solution is accomplished by treating the metals with a solution containing about 4 lbs./gal. chromic acid to about 4 fl. ozs./gal. sulfuric acid.

10. The method defined in claim 5, wherein said sequential steps are modified by the steps of activating and passivating the metals, and plating the activated and passivated metals being performed before the second mentioned resistive mask is applied, and wherein this resistive mask is applied over the at least one circuit pattern, terminal pad, and terminal tab.

11. The method defined in claim 10, wherein the step of activating and passivating the metals includes applying a solution containing about 4 lbs./gal. chromic acid to about 4 fl. ozs./gal. sulfuric acid to the metals, water rinsing, alkali cleaning, water rinsing, dipping in 10% sulfuric acid, and water rinsing.

12. The method defined in claim 5, wherein the step of activating and passivating includes alkali cleaning the metals, water rinsing, treating with an activator solution, neutralizing, water rinsing, dipping in 10% sulfuric acid, and water rinsing.

13. The method defined in claim 12, wherein the step of treating with an activator solution is accomplished by applying a solution containing about 4 lbs./gal. chromic acid to about 4 fl. ozs./gal. sulfuric acid to the metals.

14. The method defined in claim 5, additionally including the sequential steps of: water rinsing, neutralizing, water rinsing, and drying the thus plated and etched circuit board.

References Cited

UNITED STATES PATENTS 3,151,278 9/1964 Elarde ---------- 174—68.5 X

DARRELL L. CLAY, *Primary Examiner.*